(12) United States Patent
Shim et al.

(10) Patent No.: US 8,344,396 B2
(45) Date of Patent: Jan. 1, 2013

(54) ANTI-REFLECTION FILM AND FOLDABLE DISPLAY DEVICE EMPLOYING THE SAME

(75) Inventors: Hong-shik Shim, Seoul (KR); In-seo Kee, Seongnam-si (KR); Hyuk-jun Kwon, Seoul (KR)

(73) Assignees: Samsung Electronics Co., Ltd. (KR); Samsung Display Co., Ltd. (KR)

( * ) Notice: Subject to any disclaimer, the term of this patent is extended or adjusted under 35 U.S.C. 154(b) by 0 days.

(21) Appl. No.: 13/091,255

(22) Filed: Apr. 21, 2011

(65) Prior Publication Data

US 2012/0037928 A1 Feb. 16, 2012

(30) Foreign Application Priority Data

Aug. 13, 2010 (KR) .................. 10-2010-0078488

(51) Int. Cl.
*H01L 33/00* (2010.01)
*H01L 21/00* (2006.01)
*G02B 5/30* (2006.01)
*C09K 19/00* (2006.01)

(52) U.S. Cl. .............. 257/88; 257/437; 438/30; 438/72; 359/489.03; 428/1.31

(58) Field of Classification Search .................. 257/437; 438/72, 30; 359/488.01, 489.03; 428/1.31
See application file for complete search history.

(56) References Cited

U.S. PATENT DOCUMENTS

| | | | |
|---|---|---|---|
| 2005/0062913 A1* | 3/2005 | Choi et al. | 349/114 |
| 2007/0046865 A1* | 3/2007 | Umeda et al. | 349/96 |
| 2008/0106675 A1* | 5/2008 | Uesaka et al. | 349/98 |
| 2010/0062189 A1* | 3/2010 | Yosomiya et al. | 428/1.31 |
| 2010/0201603 A1* | 8/2010 | Kee et al. | 345/1.3 |
| 2011/0007042 A1* | 1/2011 | Miyaguchi | 345/204 |
| 2011/0229730 A1* | 9/2011 | Yosomiya et al. | 428/500 |
| 2012/0003400 A1* | 1/2012 | Nishimura et al. | 428/1.1 |

FOREIGN PATENT DOCUMENTS

| | | |
|---|---|---|
| JP | 09113728 A | 5/1997 |
| JP | 2007183509 A | 7/2007 |
| KR | 1020070016068 A | 2/2007 |
| KR | 1020080043260 A | 5/2008 |

\* cited by examiner

*Primary Examiner* — Cheung Lee
*Assistant Examiner* — Jeremy Joy
(74) *Attorney, Agent, or Firm* — Cantor Colburn LLP

(57) ABSTRACT

A anti-reflection film includes a light phase delay film which changes a phase of incident light, a polarizing film on the light phase delay film and transmitting light with a polarization component in a particular direction, and a protective film on the polarizing film and protecting the polarizing film. All of the polarizing film, the light phase delay film, and the protective film include flexible materials.

20 Claims, 3 Drawing Sheets

ANTI-REFLECTION FILM AND FOLDABLE DISPLAY DEVICE EMPLOYING THE SAME

CROSS-REFERENCE TO RELATED APPLICATIONS

This application claims priority to Korean Patent Application No. 10-2010-0078488, filed on Aug. 13, 2010, and all the benefits accruing therefrom under 35 U.S.C. §119, the disclosures of which are incorporated herein in their entirety by reference.

BACKGROUND

1. Field

Provided are anti-reflection films for a foldable display device and foldable display devices employing the same, and more particularly, anti-reflection films that are sufficiently flexible to be applied to a foldable display device and foldable display devices employing the same.

2. Description of the Related Art

Generally, when there is external light, the external light is reflected or scattered on an image displaying surface of a general display device, and thus visibility of an image displayed on the display device decreases. Therefore, such a problem of scattering or reflection needs to be resolved. Especially, along with the developments in mobile devices, such as mobile phones, personal digital assistants ("PDAs"), laptops, or the like, display devices are more frequently used in the outside environment with abundant external light. Therefore, a need to resolve such a problem is increasing.

Various suggestions have been made to resolve scattering/reflection of external light as stated above. For example, in the case of an organic light-emitting diode ("OLED") display device, a method of attaching an anti-reflection film on the image displaying surface of the OLED display device is generally used. Anti-reflection films of various structures are being developed. Such an anti-reflection films may absorb light reflected/scattered on the image displaying surface of a display device and transmit only the image displayed on the display device. Therefore, images displayed by a display device may be viewed more clearly.

Along with the developments in organic light emitting materials and bendable organic transistors, portable display devices that may be folded or rolled are being commercialized. For example, various foldable display devices mainly employing an OLED are being developed. It is necessary to attach anti-reflection films as stated above to the foldable display devices. However, materials for anti-reflection films developed hitherto are relatively weak to bending, and thus anti-reflection films may be damaged by repeatedly folding and unfolding the foldable display devices. For example, anti-reflection films generally employ tri-acetyl cellulose for a protective film and elongated polycarbonate ("PC") for a light phase delay film, where such materials are hard materials and are easily broken when bent.

SUMMARY

Provided are anti-reflection films that are sufficiently flexible to be applied to a foldable display device.

Provided are foldable display devices employing the same.

Additional aspects will be set forth in part in the description which follows and, in part, will be apparent from the description, or may be learned by practice of the presented embodiments.

Provided is an anti-reflection film including a light phase delay film which changes phase of incident light, a polarizing film which is arranged on the light phase delay film and only transmits light with a polarization component in a particular direction, and a protective film which is arranged on the polarizing film to protect the polarizing film. The light phase delay film, the polarizing film, and the protective film include flexible materials.

In an embodiment, for example, the light phase delay film may be formed by elongating a cyclo-olefin polymer ("COP") film in an elongation direction.

In an embodiment, the light phase delay film may be a ¼ wavelength plate, for example.

Furthermore, in an embodiment, the polarizing film may be formed by elongating a polyvinyl alcohol ("PVA") film in an elongation direction, in an iodine solution or a dichroic dye solution.

In an embodiment, it may be possible to bend or curve the anti-reflection film around a folding axis, and the elongation direction of the PVA film may be perpendicular to an elongation direction of the folding axis.

In an embodiment, the protective film may be formed of a COP film or a polyethylene terephthalate ("PET") film, which is not elongated, for example.

Furthermore, in an embodiment, the anti-reflection film may further include a release film, which is arranged below the light phase delay film.

In an embodiment, the release film may include a tetrafluoroethylene ("TFE") resin material, for example.

Provided is a foldable display device includes a foldable display panel, and an anti-reflection film which is attached on an image displaying surface of the foldable display panel and prevents scattering/reflection of external light. The anti-reflection film includes a light phase delay film which changes phase of incident light, a polarizing film which is arranged on the light phase delay film and only transmits light with a polarization component in a particular direction, and a protective film which is arranged on the polarizing film to protect the polarizing film. The light phase delay film, the polarizing film, and the protective film include flexible materials.

In an embodiment, the foldable display panel may be an organic light-emitting diode ("OLED") panel.

In an embodiment, the light phase delay film of the anti-reflection film may be arranged close to the image displaying surface of the foldable display panel, and the protective film may be arranged away from the image displaying surface of the foldable display panel.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
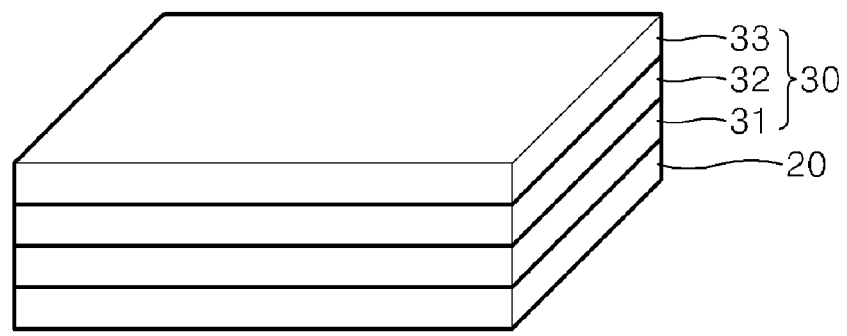
FIG. 1 schematically shows an embodiment of an anti-reflection film according to the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 schematically shows an embodiment of an anti-reflection film 30 according to an embodiment of the present invention. Referring to FIG. 1, the anti-reflection film 30 according to the present invention may include a light phase delay film 31, a polarizing film 32, and a protective film 33 directly on a release film 20 in the order stated. The release film 20 includes a resin material, such as a tetrafluoroethylene ("TFE"). The release film 20 may effectively function as a substrate. When the completed anti-reflection film 30 is attached to an image displaying surface of a display device, the release film 20 may be removed. Alternatively, if the release film 20 includes a material with light transmittance and flexibility, the release film 20 may remain attached to the image displaying surface of a display device.

The light phase delay film 31 may be formed by elongating a soft material, such as cyclo-olefin polymer ("COP"), in a direction, for example. When a COP film is elongated in a direction, polymers therein acquire directivity, and thus the elongated COP film has optical characteristics similar to that of a double refractive crystal. In other words, from light incident to the elongated COP film, light with a first polarization component, which is parallel to the direction in which the polymers are aligned, and light with a second polarization component, which is perpendicular to the direction in which the polymers are aligned, travel within the elongated COP film at different velocities. Therefore, the phase of the light with a first polarization component and the phase of the light with a second polarization component gradually differ from each other as the lights travel within the elongated COP film.

As a result of the phase of the light with a first polarization component and the phase of the light with a second polarization component gradually differing from each other as the lights travel within the elongated COP film, when the lights escape from the elongated COP film, there is a phase difference formed between the phase of the light with a first polarization component and the phase of the light with a second polarization component. Therefore, when light polarized in a direction at an angle to the direction in which the polymers are aligned (that is, the direction in which the COP film is elongated) travels in the COP film and escapes from the COP film, the polarization state of the light may be changed from the original state.

The phase difference between the light with the first polarization component and the light with the second polarization component may determined by a thickness and a degree of elongation of the light phase delay film 31. According to embodiments of the present invention, the thickness and the degree of elongation of the light phase delay film 31 may be selected such that the phase difference is λ/4 (λ is the wavelength of incident light), for example. Therefore, the light phase delay film 31 may function as a quarter-wave plate.

The polarizing film 32 may be formed by elongating a soft material, such as polyvinyl alcohol ("PVA"), in a direction. In one embodiment, for example, when a PVA film is sufficiently elongated in an iodine solution, iodine molecules may be aligned on the surfaces of the PVA film in the direction in which the PVA film is elongated. Since iodine molecules are dichroic, the iodine molecules may absorb light with a polarization component oscillating in the direction at which the PVA film is elongated and may transmit light with a polarization component oscillating in a direction perpendicular to the direction at which the PVA film is elongated. The surfaces of the PVA film may be dyed with other dichroic dyes instead of iodine.

Since PVA is water-soluble and flammable, PVA may be easily deteriorated by moisture and oxygen in the air. Furthermore, since PVA has relatively weak mechanical strength, PVA may be easily damaged by external impact. Therefore, to protect the polarizing film 32, the protective film 33 may further be disposed directly on the polarizing film 32. In one embodiment, for example, the protective film 33 may include a flexible material with excellent water resistance and light transmittance and no double refractivity, e.g., a COP film or a polyethylene terephthalate ("PET") film that is not elongated. The reason of using a material with no double refractivity is that changes in polarization due to double refractivity may affect the performance of the anti-reflection film 30. Any of various materials having properties as stated above may be used to form the protective film 33, excluding a COP film or a PET film.

As described above, in the embodiment of the anti-reflection film 30 according to the present invention, all of the light phase delay film 31, the polarizing film 32, and the protective film 33 include materials with flexibility and softness. As a result, the anti-reflection film 30 shown in FIG. 1 receives a relatively small amount stress from repetitive folding and unfolding, and thus the anti-reflection film 30 is not easily damaged and no mark of folding the anti-reflection film 30 may remain. Therefore, the anti-reflection film 30 may be used for anti-reflection of a foldable display device that may be folded or rolled.

Figure 2:
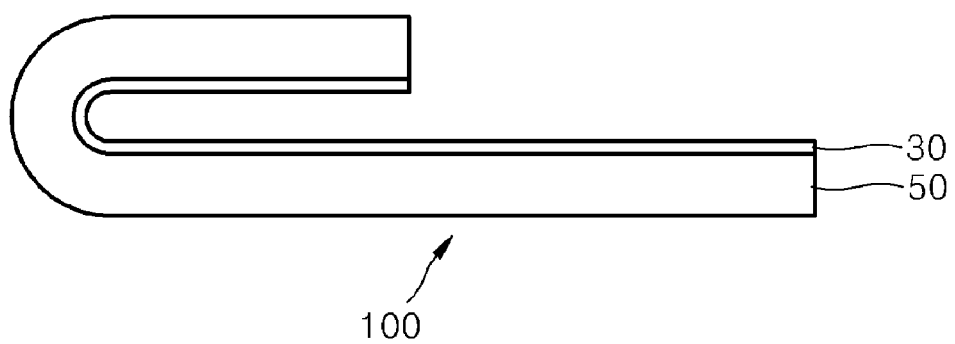
FIG. 2 shows an embodiment where the anti-reflection film shown in FIG. 1 is applied to a foldable display device.

FIG. 2 shows an embodiment where the anti-reflection film 30 shown in FIG. 1 is applied to a foldable display device 100. Referring to FIG. 2, the foldable display device 100 may include a foldable display panel 50, such as an organic light-emitting diode ("OLED") panel, and the anti-reflection film 30, which is directly attached to an image displaying surface of the foldable display panel 50. According to an embodiment of the present invention, with respect to the image displaying surface of the foldable display panel 50, the light phase delay film 31 is close to the image displaying surface of the foldable display panel 50, and the protective film 33 is far from the image displaying surface of the foldable display panel 50. That is, the light phase delay film 31 is directly on and contacting the image displaying surface of the foldable display panel 50.

Furthermore, the anti-reflection film 30 may be attached to the foldable display panel 50 after the release film 20 is removed, or the release film 20 may remain attached to the foldable display panel 50. As described above, by using the anti-reflection film 30 which may be folded without being damaged, the foldable display device 100 may display clear images even in an outside environment with abundant external light. Furthermore, the foldable display device 10 may be bent or folded without risk of damaging the anti-reflection film 30.

Figure 3:
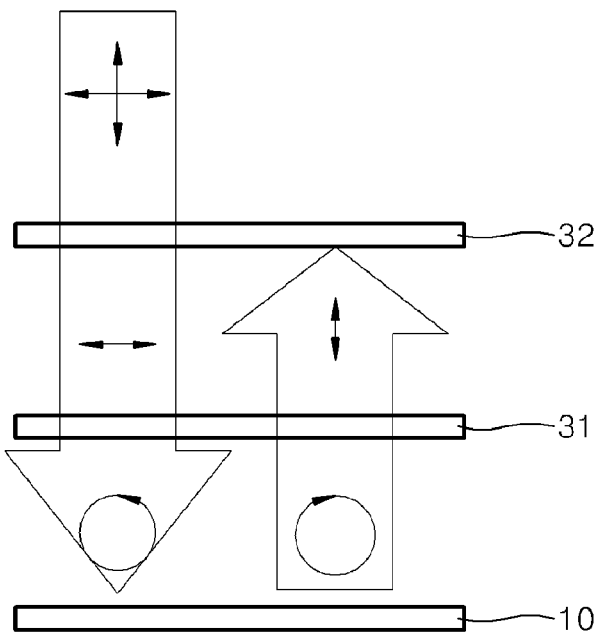
FIG. 3 is a diagram for describing the principle that scattered/reflected lights are blocked when the anti-reflection film shown in FIG. 1 according to the present invention, is attached to the foldable display device as shown in FIG. 2.

FIG. 3 is a diagram for describing the principle that scattered/reflected lights are blocked when the anti-reflection film 30 shown in FIG. 1 according to the present invention, is attached to the foldable display device 100 as shown in FIG. 2. FIG. 3 only shows the light phase delay film 31 and the polarizing film 32 of the anti-reflection film 30 for convenience of description. Referring to FIG. 3, external light, which is externally incident to the anti-reflection film 30 (indicated by the downward outlined arrow), becomes a linearly polarized light (double headed horizontal arrow) having a polarization component in a particular direction as the light passes through the polarizing film 32. Next, the linearly polarized light passes through the light phase delay film 31. As described above, the light phase delay film 31 functions as a ¼ wavelength plate. Therefore, linear polarization is changed to circular polarization as the light passes through the light phase delay film 31. Next, as the circularly polarized light is reflected by a reflection plate 10 (indicated by the upward outlined arrow), the direction of polarization is reversed (double headed vertical arrow). In embodiments, for example, left-circular polarization is changed to right-circular polarization, or vice versa. Although simply shown as the reflection plate 10 in FIG. 3, the reflection plate 10 may be equivalent to the image displaying surface of the foldable display panel 50 or a reflective electrode (not shown) within the foldable display panel 50.

The circularly polarized light, of which the direction of polarization is reversed as the circularly polarized light is reflected by the reflection plate 10, is changed to a linearly polarized light as the circularly polarized light passes through the light phase delay film 31 again. Here, the direction of polarization of the linearly polarized light is perpendicular to the direction in which the light was initially polarized after the light has passed through the polarizing film 32. Therefore, light, which is reflected by the reflection plate 10 and has passed through the light phase delay film 31, cannot pass through the polarizing film 32 and is absorbed thereby. As a result, light externally incident to the anti-reflection film 30 cannot escape to the outside through the anti-reflection film 30. On the contrary, light incident to the anti-reflection film 30 from a display panel below the anti-reflection film 30 may pass through the anti-reflection film 30. Therefore, a viewer may view clear images from which an external light component is removed.

Figure 4:
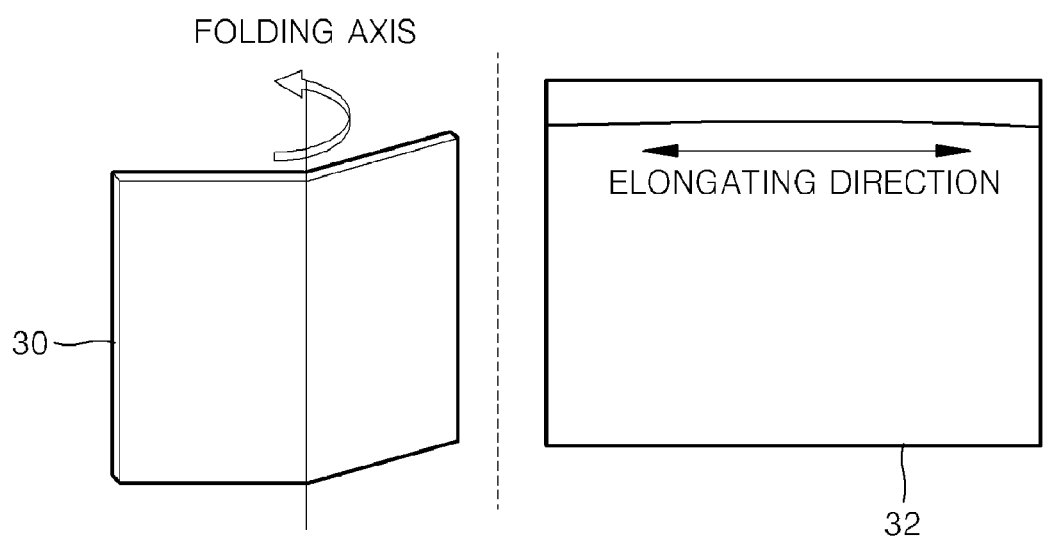
FIG. 4 shows an example of relationships between directions of elongating a material of a polarizing film of the anti-reflection film as shown in FIG. 1, and a folding axis of the anti-reflection film.

Also, according to an embodiment of the present invention, the possibilities that the polarizing film 32 is damaged or deformed may further be reduced by suitably selecting a direction of elongating a material of the polarizing film 32, such as PVA. FIG. 4 shows an example of relationships between directions of elongating a material of the polarizing film 32 and a folding axis of the anti-reflection film 30 (or, the folding axis of the foldable display device 100). The left side of FIG. 4 shows a folding axis of the anti-reflection film 30 in a vertical direction. As shown in the left side of FIG. 4, the anti-reflection film 30 employed in the foldable display device 100 may be bent or curved around the vertical folding axis. Furthermore, the right side of FIG. 4 shows that the direction of elongating a material of the polarizing film 32 is a horizontal direction.

As shown in FIG. 4, in the case where the direction of the folding axis of the anti-reflection film 30 and the direction in which the material of the polarizing film 32 is elongated are perpendicular to each other, stress on the polarizing film 32 when the polarizing film 32 is folded is further reduced. Therefore, the polarizing film 32 may perform its functions without being damaged or deformed even if the polarizing film 32 is repeatedly folded and unfolded for a long period of time. According to an experiment, in the case where the direction of the folding axis of the anti-reflection film 30 and the direction in which the material of the polarizing film 32 is elongated are perpendicular to each other, the polarizing film 32 was not damaged after the polarizing film 32 was folded and unfolded for about 60,000 times.

Figure 5:
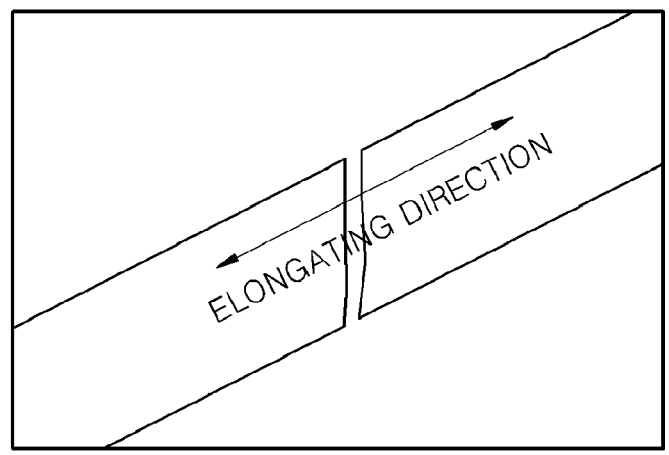
FIG. 5 shows an example of the polarizing film damaged in the case where the direction of elongating the polarizing film and the folding axis of the anti-reflection film are not perpendicular to each other.

However, as shown in FIG. 5, in the case where the direction in which the material of the polarizing film 32 is elongated at angle with respect to the direction of the vertical folding axis of the anti-reflection film 30, the polarizing film 32 has a relatively short lifespan. According to an experiment, in the case where the direction in which the material of the polarizing film 32 is elongated at an angle with respect to the direction of the folding axis of the anti-reflection film 30, the polarizing film 32 was damaged after the polarizing film 32 was folded and unfolded for about 5,000 times.

Figure 6:
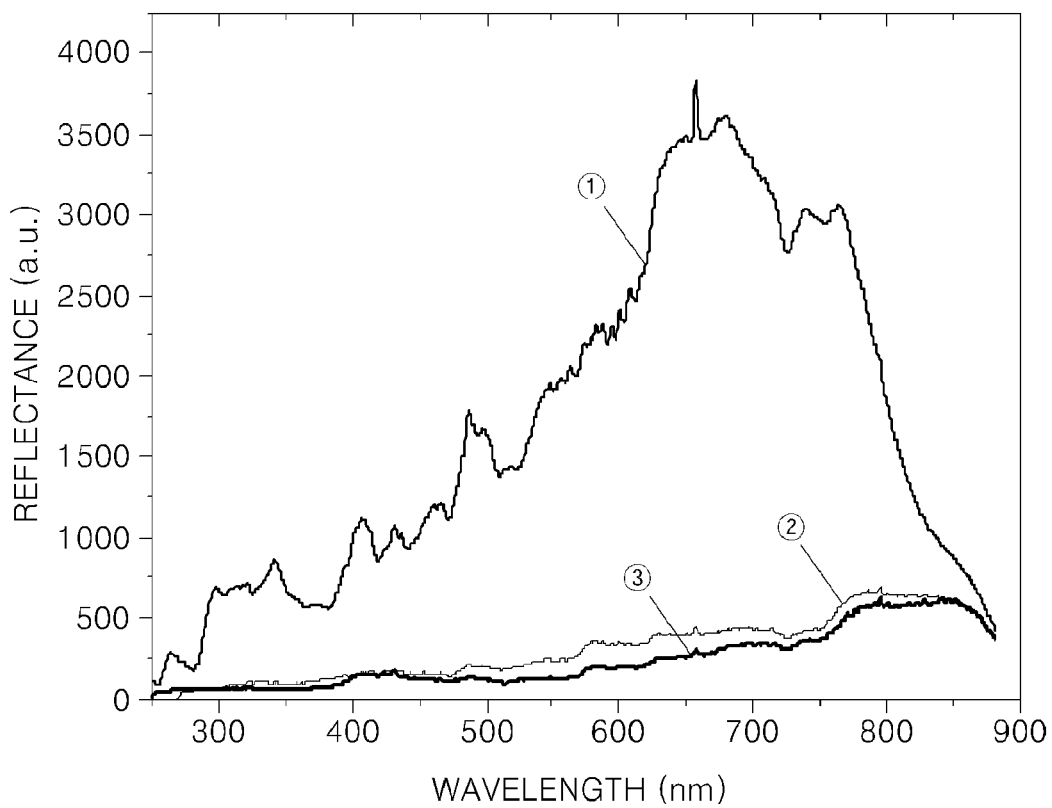
FIG. 6 is a graph showing anti-reflection effect of an exemplary embodiment of the anti-reflection film as shown in FIG. 1 according to the present invention.

FIG. 6 is a graph showing an embodiment of anti-reflection effect of the anti-reflection film 30 according to the present invention. In FIG. 6, the horizontal axis indicates wavelengths in nanometers (nm) of incident light, whereas the vertical axis indicates intensities of reflected light in arbitrary units (a.u.). Furthermore, in FIG. 6, line '①' indicates intensity of reflected light in the case where a polarizing film is omitted, line '②' indicates intensity of reflected light in the case where a conventional anti-reflection film formed of a hard material is used, and line '③' indicates intensity of reflected light in the case where the anti-reflection film 30, which is formed of a soft and flexible material, according to an embodiment of the present invention is used. Referring to FIG. 6, it is clear that, compared to the case where no anti-reflection film is used, intensity of reflected light is significantly reduced by using an anti-reflection film. Furthermore, a difference between intensity of reflected light in the case where a conventional anti-reflection film formed of a hard material is used and intensity of reflected light in the case where the anti-reflection film 30 according to an embodiment of the present invention is used is insignificant. Therefore, the anti-reflection film 30 according to an embodiment of the present invention may be easily bent or curved and have an anti-reflection performance of the anti-reflection film 30 that is similar to that of a conventional anti-reflection film.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. An anti-reflection film comprising:
    a light phase delay film which changes a phase of incident light;
    a polarizing film on the light phase delay film, wherein the polarizing film only transmits light with a polarization component in a particular direction; and
    a protective film on the polarizing film, wherein the protective film protects the polarizing film,
    wherein the light phase delay film, the polarizing film, and the protective film comprise flexible materials,
    wherein the anti-reflection film is bent around a folding axis, and
    wherein the polarizing film is an elongated film with an elongation direction which is perpendicular to a direction of the folding axis.

2. The anti-reflection film of claim 1, wherein the light phase delay film comprises an elongated cyclo-olefin polymer film with an elongation direction.

3. The anti-reflection film of claim 1, wherein the light phase delay film is a quarter-wave plate.

4. The anti-reflection film of claim 1, wherein the polarizing film comprises an elongated polyvinyl alcohol film with an elongation direction.

5. The anti-reflection film of claim 4, wherein
    the elongation direction of the polyvinyl alcohol film is perpendicular to an elongation direction of the folding axis.

6. The anti-reflection film of claim 1, wherein the protective film comprises a cyclo-olefin polymer film or a polyethylene terephthalate film, which is not elongated.

7. The anti-reflection film of claim 1, further comprising a release film, which is arranged opposite to the protective film with respect to the light phase delay film.

8. The anti-reflection film of claim 7, wherein the release film comprises a tetrafluoroethylene resin material.

9. A foldable display device comprising:
    a foldable display panel; and
    an anti-reflection film on an image displaying surface of the foldable display panel, wherein the anti-reflection film prevents scattering/reflection of external light,
    wherein the anti-reflection film comprises:
        a light phase delay film which changes a phase of incident light;
        a polarizing film on the light phase delay film, wherein the polarizing film only transmits light with a polarization component in a particular direction; and
        a protective film on the polarizing film, wherein the protective film protects the polarizing film, and
        the light phase delay film, the polarizing film, and the protective film comprise flexible materials,
    wherein the anti-reflection film is bent around a folding axis, and
    wherein the polarizing film is an elongated film with an elongation direction which is perpendicular to a direction of the folding axis.

10. The foldable display device of claim 9, wherein the foldable display panel is an organic light-emitting diode panel.

11. The foldable display device of claim 9, wherein
    the light phase delay film of the anti-reflection film is adjacent to the image displaying surface of the foldable display panel, and
    the protective film is opposite from the image displaying surface of the foldable display panel with respect to the light phase delay film.

12. The foldable display device of claim 9, wherein the light phase delay film comprises an elongated cyclo-olefin polymer film with an elongation direction.

13. The foldable display device of claim 9, wherein the light phase delay film is a quarter-wave plate.

14. The foldable display device of claim 9, wherein the polarizing film comprises an elongated polyvinyl alcohol film with an elongation direction.

15. The foldable display device of claim 14, wherein the elongation direction of the polyvinyl alcohol film is perpendicular to an elongation direction of the folding axis.

16. The foldable display device of claim 9, wherein the protective film comprises a cyclo-olefin polymer film or a polyethylene terephthalate film, which is not elongated.

17. A method of forming a foldable display device, the method comprising:
   forming an anti-reflection film; and
   disposing an anti-reflection film on an image displaying surface of a foldable display panel, wherein the anti-reflection film prevents scattering/reflection of external light;
   wherein the forming an anti-reflection film comprises:
      forming a light phase delay film which changes a phase of incident light;
      disposing a polarizing film on the light phase delay film, wherein the polarizing film only transmits light with a polarization component in a first direction; and
      disposing a protective film on the polarizing film, wherein the protective film protects the polarizing film,
   the light phase delay film, the polarizing film, and the protective film comprising flexible materials,
   wherein the anti-reflection film is bent around a folding axis, and
   wherein the polarizing film is an elongated film with an elongation direction which is perpendicular to a direction of the folding axis.

18. The method of claim 17, wherein the forming a light phase delay film includes elongating a cyclo-olefin polymer film in an elongation direction.

19. The method of claim 18, further comprising forming the polarizing film by elongating a polyvinyl alcohol film in an elongation direction film, in an iodine solution or a dichroic dye solution.

20. The method of claim 19, wherein the elongation direction of the polyvinyl alcohol film is perpendicular to an elongation direction of the folding axis.

* * * * *